US007580302B2

(12) United States Patent
Ho et al.

(10) Patent No.: US 7,580,302 B2
(45) Date of Patent: Aug. 25, 2009

(54) PARALLEL THRESHOLD VOLTAGE MARGIN SEARCH FOR MLC MEMORY APPLICATION

(75) Inventors: Wen Chiao Ho, Tainan (TW); Chin Hung Chang, Tainan (TW); Cheng-Chi Liu, Shulin (TW); Kuen-Long Chang, Taipei (TW); Chun Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 445 days.

(21) Appl. No.: 11/551,974

(22) Filed: Oct. 23, 2006

(65) Prior Publication Data

US 2008/0094891 A1 Apr. 24, 2008

(51) Int. Cl.
*G11C 29/00* (2006.01)
(52) U.S. Cl. .............. 365/201; 365/185.22; 365/185.14
(58) Field of Classification Search ................. 365/201, 365/185.22, 185.14
See application file for complete search history.

(56) References Cited

U.S. PATENT DOCUMENTS

| 5,768,193 | A | 6/1998 | Lee et al. |
| 5,841,786 | A * | 11/1998 | Keyes ......................... 714/718 |
| 5,978,286 | A | 11/1999 | Chang et al. |
| 6,108,266 | A | 8/2000 | Weier et al. |
| 6,191,977 | B1 | 2/2001 | Lee |
| 6,229,734 | B1 | 5/2001 | Watanabe |
| 6,240,032 | B1 | 5/2001 | Fukumoto |
| 6,269,039 | B1 | 7/2001 | Glossner, III et al. |
| 6,483,745 | B2 | 11/2002 | Saeki |
| 6,504,789 | B2 | 1/2003 | Hirakawa |
| 6,538,923 | B1 | 3/2003 | Parker |
| 6,636,440 | B2 | 10/2003 | Maayan et al. |
| 6,668,303 | B2 | 12/2003 | Pio |
| 6,728,819 | B2 | 4/2004 | Farmwald et al. |
| 6,731,557 | B2 | 5/2004 | Beretta et al. |
| 6,754,125 | B2 | 6/2004 | Fournel et al. |
| 6,885,610 | B2 | 4/2005 | Takayanagi |
| 2002/0024844 | A1 | 2/2002 | Saeki |

OTHER PUBLICATIONS

U.S. Appl. No. 11/382,330 filed on May 9, 2006 entitled "Method and Apparatus to Improve Nonvolatile Memory Data Retention," Inventor Chung Kuang Chen.
U.S. Appl. No. 11/382,350 filed May 9, 2006 entitled "Method and Apparatus to Improve Nonvolatile Memory Data Retention," Inventor Chung Kuang Chen.
U.S. Appl. No. 11/614,791 filed on Dec. 21, 2006 entitled "Method and Apparatus to Control Sensing Time for Nonvolatile Memory," Inventors Chung Kuang Chen et al.

* cited by examiner

*Primary Examiner*—Hoai V Ho
*Assistant Examiner*—Jason Lappas
(74) *Attorney, Agent, or Firm*—Haynes Beffel & Wolfeld LLP

(57) ABSTRACT

A method for determining read voltage margins in a memory array compares as-read sum codes generated from data read from the memory array with expected sum codes generated from the loaded data. The read voltage (Vt) is stepped and the as-read sum codes are compared to the expected sum codes to determine the Vt range(s) that provides matching sum codes. Multiple read voltage margins (i.e. the read voltage margins between multiple programming levels of the MLC memory array) are determined in a parallel fashion as Vt is stepped across its range.

19 Claims, 8 Drawing Sheets

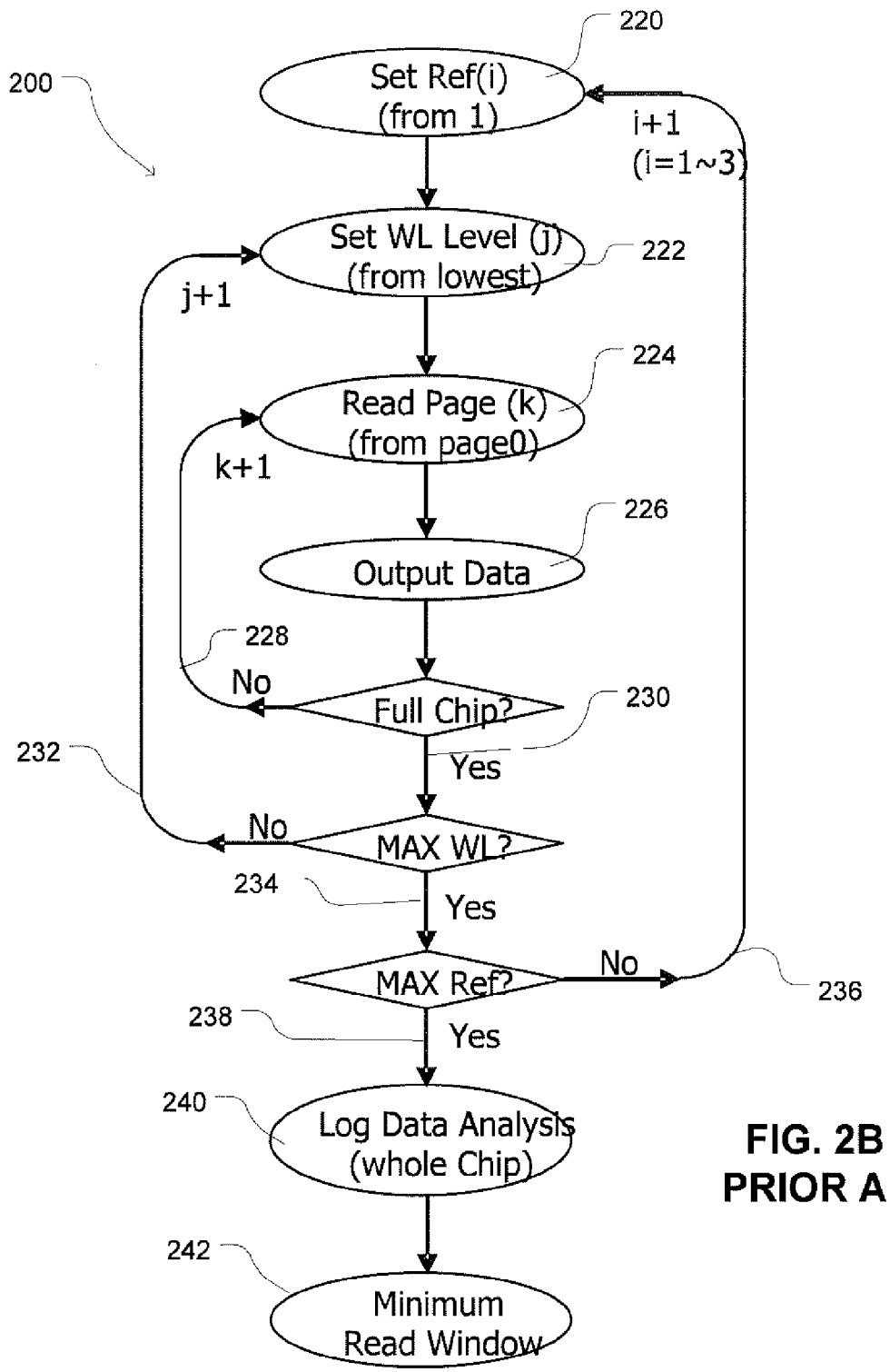
FIG. 2B – PRIOR ART

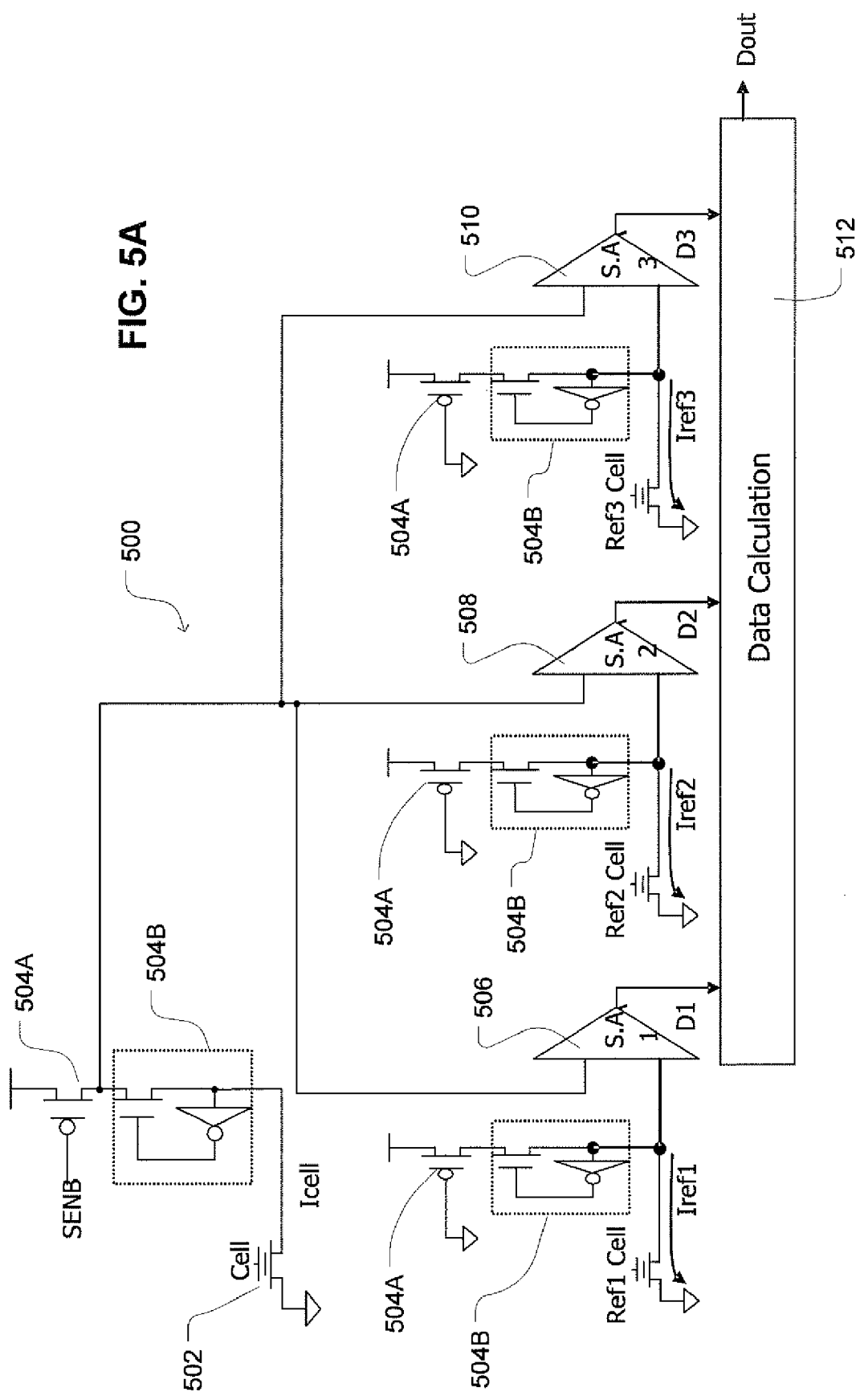

| WL Level | 4.5 | 4.6 | 4.7 | 4.8 | 4.9 | 5 | 5.1 | 5.2 | 5.3 | 5.4 | 5.5 | 5.6 | 5.7 | 5.8 | 5.9 | 6 | 6.1 |
|---|---|---|---|---|---|---|---|---|---|---|---|---|---|---|---|---|---|
| Ref1 is wrong? | 1 | 1 | 1 | 0 | 0 | 0 | 0 | 0 | 1 | 1 | 1 | 1 | 1 | 1 | 1 | 1 | 1 |
| Ref2 is wrong? | 1 | 1 | 1 | 1 | 1 | 0 | 0 | 0 | 0 | 0 | 1 | 1 | 1 | 1 | 1 | 1 | 1 |
| Ref3 is wrong? | 1 | 1 | 1 | 1 | 1 | 1 | 1 | 1 | 0 | 0 | 0 | 0 | 1 | 1 | 1 | 1 | 1 |

FIG. 5C

PARALLEL THRESHOLD VOLTAGE MARGIN SEARCH FOR MLC MEMORY APPLICATION

BACKGROUND OF THE INVENTION

1. Field of the Invention

The present invention relates to memory devices based on multi-level cells ("MLCs"), and more particularly to techniques for reading MLC-based memory devices.

2. Description of Related Art

Conventional flash memory cells store charge on a floating gate structure or other charge storage structure. The stored charge changes the threshold voltage (Vth) of the memory cell. In a read operation, a read voltage is applied to the gate of the memory cell, and whether or not the memory cell turns on (e.g. conducts current), or alternatively, the amount of current conducted, indicates the programming state of the memory cell. For example, a memory cell that conducts relatively high current during a read operation might be assigned a digital value of "1", and a memory cell that conducts very little or no current during a read operation might be assigned a digital value of "0". Charge is added to and removed from the charge storage structure to program and erase the memory cell, i.e., to change the stored value from 1 to 0. The charge is retained by the charge storage structure until the memory cell is erased, retaining the data state without continuously applied electrical power, which is very desirable for flash-memory applications.

MLCs have been developed that can indicate (store) multiple data values by providing selectively different amounts of charge on the charge storage structure. Basically, a little bit of negative charge slightly increases Vth of the memory cell, and more negative charge further increases Vth. A read operation is used to determine to what state the memory cell has been charged (programmed). For example, in a four level cell storing 2 bits of data, if $Vth_0$ represents the threshold voltage when the MLC has not been programmed or has been erased (which can be a state in which essentially there is no charge on the charge storage structure), $Vth_1$ represents the threshold voltage when a relatively small amount of negative charge has been transferred onto the charge storage structure, $Vth_2$ represents the threshold voltage when more negative charge has been transferred onto the charge storage structure, and $Vth_3$ represents the threshold voltage when more negative charge has been transferred onto the charge storage structure. Applying a read (wordline or gate) voltage between $Vth_0$ and $Vth_1$ and sensing current through the device will indicate whether the device has been programmed, and then applying a wordline voltage between $Vth_1$ and $Vth_2$ and sensing whether the device has turned on will indicate whether the device has been programmed to the first level or to the second level, and so on. Alternatively, a constant wordline voltage is applied, and the current conducted by the cell is compared to three reference currents in parallel. In this way, all four levels of the MLC can be sensed in one read operation.

Memory arrays incorporating MLCs are typically read in the well-known fashion of applying a read voltage (Vt) to a selected wordline, and then sensing current or voltage on bitlines coupled to a block of the MLCs activated by the wordline using a bank of sense amplifiers. A typical read operation is page-based. For example, a two giga-bit ("2 Gb") memory device (or memory array in an IC) can be configured as 128,000 two kilo-byte ("2 KB") pages. The sensed values are loaded into a data latch or buffer, as is well known in the art of flash memory devices. See, for example, U.S. Pat. No. 6,538,923, issued Mar. 25, 2003 to Parker. A page is then programmed and read in a sequence of operations on blocks that match the number of sense amplifiers. The sense amplifiers include a reference in the case of a sequential read operation for the multiple levels, or a set of references for a parallel read of the multiple levels, against which a voltage or current on the bit line is compared to detect the Vth of the cell, and therefore the memory state.

However, the Vth of the cells within an array, and within a single page of the array, that are programmed to a particular memory state can vary over a distribution of threshold voltages. Thus, a read voltage applied to read an MLC, or a reference current used for sensing the output current of an MLC, must fall within the spacing between the Vth voltage distributions for the multiple programming levels. This spacing is referred to as the read voltage window or read margin. It is important to verify that an MLC device has sufficient read voltage windows.

Conventional techniques for determining read margins that search the boundaries of distributions for each Vth level for each page at each programming level are time-consuming and use a lot of storage capacity (tester memory) to log the data read from the chip for all the different programming levels. Techniques for determining read margins that avoid the problems of the prior art are desirable.

SUMMARY OF THE INVENTION

A method of operating a memory array comprising MLCs that store multiple bits per cell to determine read margins for the multiple threshold levels across the array, includes executing a program operation to store a known data set in a tested block of the array, with each cell in the tested block storing one code of a set of multiple bit codes, where each multiple bit code in the set corresponds to one of the multiple threshold levels that can be programmed in the cell. For a 2-bit code, there are four 2-bit codes in the set, and four threshold levels used in the memory cell to represent the four codes. The multiple bit codes in the known data set include a known count of codes, represented by an expected sum code as described herein, corresponding to a first threshold level and a known count of codes corresponding to a second threshold level, and so on. After executing the program operation, the tested block is read using a first wordline voltage, and a first as-read sum is determined that indicates a first number of memory cells programmed to a first programming level, and a second as-read sum is determined that indicates a second number of cells programmed to the second programming level. The first as-read sum code is compared to the first known count for the first threshold level, and the second as-read sum code is compared to the second known count for the second threshold level to provide sum code comparison information. The wordline voltage is stepped through a specified range of voltages in small increments, or through a portion of the specified range, with as-read sum codes and/or comparison information being logged for each stepped voltage. In a particular embodiment, the wordline voltage is stepped such as in 100 mV steps through a specified range of wordline voltages. The logged as-read sum codes and/or comparison information for the range of wordline voltages is used to determine a read window between the first programming level and the second programming level, where the read window is a range of wordline voltages within which the wordline voltage levels applied generate sum codes matching the known count within the tested block of the array.

In a particular embodiment, the memory array comprises two-bit per cell multi-level cells ("MLCs") and the data set has a third known count of codes corresponding to a third threshold level. In this case, the first known count indicates a number of MLCs programmed to the first programming level, to the second programming level, or to the third programming level, and the second known count indicates a number of MLCs programmed to the second programming level or to the third programming level. A third as-read sum code is calculated in addition to the first as-read sum code and the second as-read sum code. The third as-read sum code indicates a third number of MLCs at the third programming level, the first as-read sum code indicates a first read number of MLCs at the first programming level, the second programming level, and the third programming level, and the second as-read sum code indicates a second read number of MLCs at the second programming level and the third programming level. The first as-read sum code is compared to the first known count, the second as-read sum code to the second known count, and the third as-read sum code to the third known count to provide first sum code comparison information.

In a particular embodiment, the tested block of cells is a page of a multi-level cell ("MLC") memory device, or other portion of a memory array subject of a read operation, and a page read window is determined between the first programming level and the second programming level using the sum codes and/or comparison information. The page read window is stored for later page read operations. Alternatively, the tested block of the memory array is a portion of a page of an MLC memory device.

In a particular embodiment, the tested block of the memory array is a two-thousand byte ($2^{14}$ bits) page and the as-read sum codes include 15 bits <0:14> for each of N−1 levels stored in the N-level cell. Thus, for a four level cell, three as-read sum codes are produced, and for a 2K byte page, three 15-bit as-read sum codes are produced for a total of 45 bits of data per page (a 2K byte page stores 16K bits). Thus, more generally, for a test block that comprises $2^{N-1}$ bits, and the first as-read sum code, second as-read sum code, and third as-read sum code consist of respective N bit codes. Analysis for the purpose of margin testing or margin searching is done as described herein on the set of N-bit codes, rather than on the set of $2^{N-1}$ bits of data, substantially reducing the memory resources needed in the testing process.

The sum codes and/or comparison information are also optionally used to verify correct programming operation. For example, if the as-read sum code(s) is(are) lower than the expected (known) sum code(s), another programming pulse can be applied to the selected memory cells in the memory array, and a new sum code is read and compared to the expected sum code.

The techniques applied herein are also applicable to a single level cell-based memory array.

In a particular embodiment, reading the MLC memory array comprising two bits per cell at the first wordline voltage includes simultaneously comparing a cell current of a memory cell against a first reference value, a second reference value, and a third reference value to produce two-bit data output indicating a programming state of the memory cell.

In one embodiment, an integrated circuit ("IC") with an MLC memory array includes a built-in self test ("BIST") design, including logic, such as a state machine and other dedicated circuitry, a processor controlled by software, or a combination of processor and dedicated circuitry, configured to operate the MLC memory array according to techniques described above. In a particular embodiment, the BIST logic provides a PASS/FAIL result to a tester, from the IC indicating whether any page in the array meets the specified minimum read margins.

Other aspects and advantages of the present invention can be seen on review of the drawings, the detailed description and the claims, which follow.

BRIEF DESCRIPTION OF THE DRAWINGS

FIG. 2B illustrates a prior art method of determining the read voltage windows of an MLC-based memory.

FIG. 5A is an example of a sensing architecture according to an embodiment.

FIG. 5C shows sum code comparison information for a page of MLC memory in an IC.

DETAILED DESCRIPTION

A detailed description of techniques for read margin search in MLC-based memory arrays is provided with reference to FIGS. 1-6.

Figure 1:
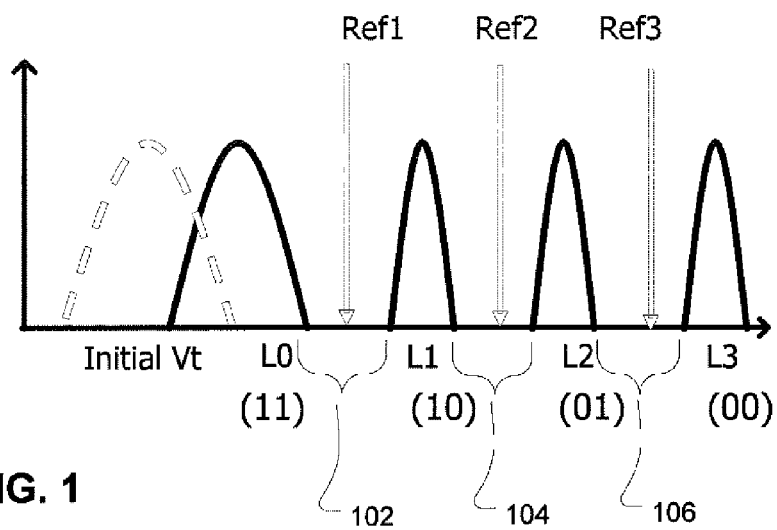
FIG. 1 shows the Vth distributions for multiple threshold levels of an exemplary MLC product.

FIG. 1 is a graph 100 showing the read voltage Vt distributions of an exemplary MLC product storing two-bits per cell. The vertical axis represents the number of cells in a memory array programmed to a threshold level and the horizontal axis is the Vt applied to the wordlines of the MLCs that would overcome the transferred charge on the charge storage structure of the cell and allow the cell to conduct current. Four distributions are shown for levels L0, L1, L2, L3 (states or data values). For purposes of convenient discussion, level L0 represents a digital data value of 11, L1 represents a digital data value of 10, L2 represents a digital data value of 01, and L3 represents a digital data value of 00; however, these representations are arbitrary, and other value definitions are possible.

The state (value) of an MLC can be determined by applying a read voltage to the wordline of the MLC, and sensing current through the cell. For example, if the MLC is programmed to threshold level L1, L2, or L3, a read voltage within a first Vt margin 102 (e.g. REF1) will not turn the MLC on (i.e. to a state that conducts current above a reference level through the cell to a bit line). When the current through the MLC is compared to a reference (e.g. by a sense amplifier), the user knows that the MLC is at the lowest level L0 (which often represents an erased cell). Applying voltages to the wordline within the second 104 and third 106 Vt windows distinguishes between levels L1 and L2, and between levels L2 and L3, in a similar fashion.

Figure 2A:
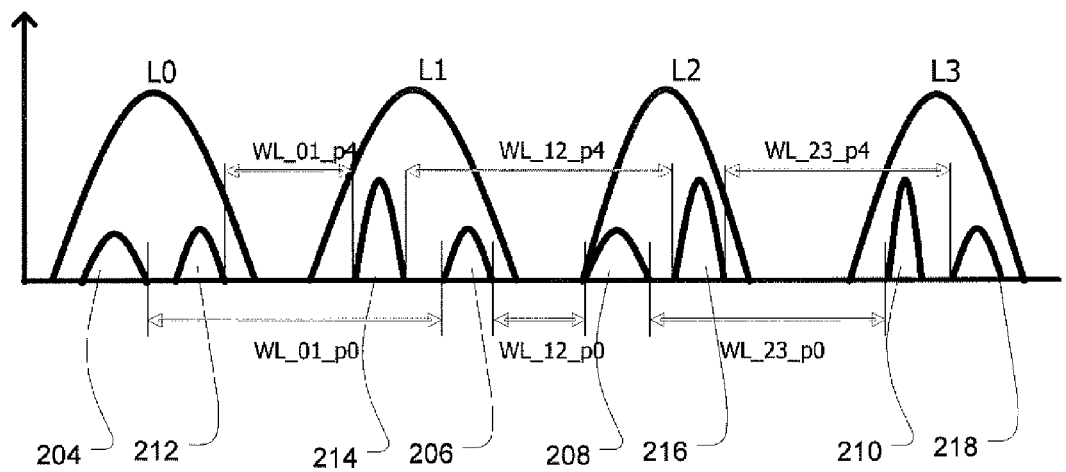
FIG. 2A shows threshold voltage cell distributions for two different pages of an MLC memory product.

FIG. 2A shows threshold voltage distributions for two different pages of an MLC memory product. Curves L0, L1, L2 and L3 represent distributions of threshold voltages within specified ranges for the chip. The curves 204, 206, 208, 210 represent the distribution of read voltages found on a page within the chip for the different programming levels. For example, page 0 ("P0") has a distribution 204 of threshold voltages for level L0, and a distribution 206 of threshold voltages for level L1. The Vt window (read window) between L0 and L1 on P0 is the voltage difference WL_01_P0 between the high boundary of distribution 204 and the low boundary of distribution 206. Similarly, WL_12_P0 represents the Vt window between the high boundary of distribution 206 of threshold voltages for level L1, and the low boundary of distribution 208 of threshold voltages for level L2 on P0, and WL_23_P0 represents the Vt window between the high boundary of distribution 208 of threshold voltages for level L2, and a low boundary of distribution 210 of threshold voltages for level L3 on P0.

A second page P4 has different distributions 212, 214, 216, 218 for respective levels L0, L1, L2, L3. As described above, the Vt windows for P4 are WL_01_P4, WL_12_P4, and WL_23_P4. In this simplified example, the narrowest read window for any page between any two levels is WL_12_P0. MLC memory products typically have a minimum read window specification (e.g. 300 mV). If WL_12_P0 is less than the minimum read window specification is (i.e. less than 300 mV), the product fails testing. Different pages in an MLC memory product may, and typically do, have different Vt windows, and have different read voltage windows between different sets of values.

Conventional read margin testing methods search for the Vt margin (read window) by stepping the wordline level from a lowest value to a highest value for a specified window, and logging the results sensed at the stepped wordline voltages. The results are compared to the programmed data set that is known in advance. The logged results are analyzed to find the upper and lower boundaries of the margin. The page-based read/step WL process is repeated three times in a two-bit per cell MLC product (once for each read window) for each page, until the entire MLC memory array has been read and margins logged.

This approach has several drawbacks. The boundary of each level for each page is searched to calculate the read window, which takes considerable time. A large tester memory is needed to store the bit information of the entire chip (e.g. two giga-bits in the example above). The log data from the entire chip is evaluated to calculate the boundary of each read unit, and this must be done for each read window (e.g. three times in a four-bit MLC device).

FIG. 2B is a flow chart illustrating a prior art method 200 of determining the read voltage windows (Vt margin search) of an MLC-based memory. A reference value is set (e.g. reference level 1 ("REF1")) representing a first data value (step 220), and coupled to a sense amplifier array. The wordline level applied to the page is set to the lowest level in a specified range (step 222) (or alternatively to the highest level or an arbitrary level). The page is read (step 224) and the data output and logged in the tester memory (step 226). If the full chip has not been read (branch 228), the page number is incremented (k+1) and this loop is repeated until all pages in the memory are read at this wordline level (branch 230). If the wordline voltage is not at the maximum allowed value (branch 232), the wordline voltage is incremented (j+1) and the loop (branch 228) is repeated for each wordline voltage value until the maximum wordline voltage is reached (branch 234).

If the reference value is not the maximum reference value (e.g. REF3) (branch 236), the reference value is stepped (i+1) (e.g. from REF1 to REF2 or from REF2 to REF3), and loops 228 and 232 are repeated for each page and each wordline level. After the wordline voltage has been stepped for all three reference values (branch 238), the logged data for the entire chip is analyzed (step 240) and the minimum read window for the chip is determined (step 242). The minimum read window is the narrowest read window between any two values on any page of the device.

In contrast to the prior art, embodiments of the invention use as-read sum codes to determine the minimum read window of an MLC-based memory product, rather than full chip logs as used in the process of FIG. 2B. The as-read sum codes indicate the number of cells at a given threshold level read in each page for each read level. In a two-bit MLC, there are three read voltage windows, one between L0 and L1, a second between L1 and L2, and a third between L2 and L3. Thus, three as-read sum codes are used. Other embodiments have more or fewer data levels, with a corresponding increase or decrease in the number of read voltage windows. For convenience of discussion, a two-bit MLC will be used in an example, and three as-read sum codes SUM1, SUM2, and SUM3 will be illustrated.

Figure 3:
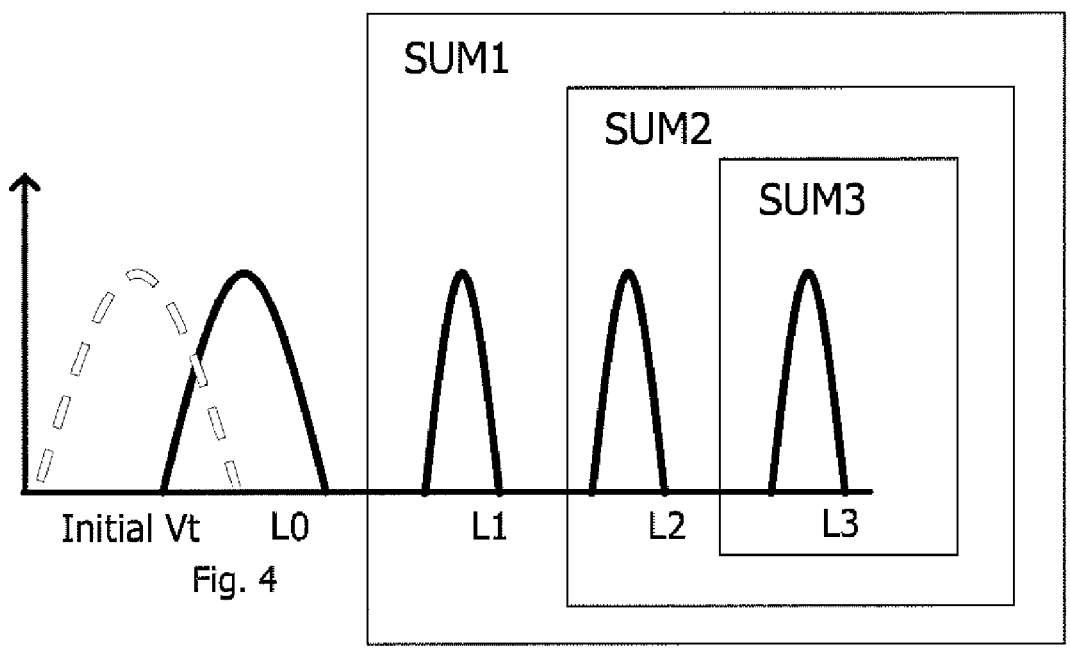
FIG. 3 is a chart used for explaining sum code generation.

FIG. 3 shows sum codes generated in parallel in relation to programming levels in an MLC-based memory array. SUM3 is the number of cells sensed at programming level three L3. For example, if a page is two kilobytes with two bits per cell, we will have a 15-bit width for SUM3 [0:14] since the highest number cells programmed to level L3 is 16K (which means all the MLCs in the page have been programmed to L3). The least bit number of level three is 0 (which means that whole page does not have any MLCs programmed to L3).

SUM2 is the number of cells sensed at programming levels L2 and L3. The two kilo-byte page might have none of the MLCs on the page programmed to L2 or L3 (i.e., each bit on the page is at L1 or L0), in which case the number is 0, or all MLCs are L2 or L3, in which case the number is 16K. Thus, SUM2 has a 15-bit width as well. If SUM 2 is not 0, the number of MLCs at L2 can be determined by subtracting SUM3 from SUM2.

SUM1 is the number of cells sensed at programming levels L1, L2, and L3. Again, SUM1 has a 15-bit width, and the number of cells programmed to L1, L2, and L3 may be determined using SUM1, SUM2, and SUM3. If the bit number for SUM1 is zero, then all MLCs on the page are assumed to be at L0. The entire two kilo-byte page can be represented using only forty-five bits (fifteen bits for each of the three levels).

The expected values for SUM1, SUM2, and SUM3 are known from the data that will be programmed into the page of the MLC array. These expected sum codes are calculated prior to or after loading the data into the memory array according to the data values assigned to each of the MLCs, and the expected sum codes are compared to the sum codes read after the MLC page has been programmed. If the expected sum code matches the as-read sum code, an accurate reading of the page has occurred. In other words, the page was read using a read voltage applied to the wordline that is within the read margin window.

The internal logic controls the testing read process of the MLC memory device to execute repeated read cycles until a load buffer is full of one page of information (refer to FIG. 5A for an example of a read architecture). The sum code of the page determined from the read data values (MLC levels) is compared to an expected sum code for that page. For example, if the programmed page has (SUM3, SUM2, SUM1)=(15' h 0BFF, 15' h 33FF, 15' h 3C00) then there are 3071 (3K−1) bits of L3; 10240 (10K) bits for L2; 2049 (2K−1) bits of L1; and 1024 (1K) bits of L0. So the SUM3=(3K−1); SUM2=(13K−1); SUM1=(15K). However, after a read operation, we may get new sum codes (SUM3, SUM2, SUM1)=(15' h 0BFD, 15' h 33FF, 15' h 3C00). The new sum codes show that there are two bits at L3 that are being read as L2 under the read bias condition (wordline voltage). The level three reference level (REF3) is wrong, and it means REF3 should be adjusted lower if we want to get correct data.

If for the same data set however, after a read operation, we get as-read sum codes (SUM3, SUM2, SUM1)=(15' h 0BFF, 15' h 33FE, 15' h 3C02), we will know that there is one bit at L2 that is being read as L1 and two bits at L0 that are being read as L1 under the read bias condition (wordline voltage). In this example, both REF2 and REF1 should be adjusted in order to read the correct data values for the entire page.

Programming level L1 has a program-verify level PV1 ("lower Vt limit") that is generally at the lower end of the allowable Vth distribution for MLCs in the memory array programmed to L1, and an upper limit EV1 of L1. Similarly, programming level L2 has a lower limit PV2 for MLCs programmed to L2, and an upper Vt limit EV2. The third programming level L3 has similar limits, which are not specifically indicated for simplicity of illustration.

Similar techniques can be applied with MLC-based, one-bit per cell memory arrays.

A method of operating an MLC-based memory array according to an embodiment of the invention for testing read margins is described. First and second expected sum codes are calculated from array data (i.e. data that will be or has been programmed into an MLC test block, such as a selected page, of an MLC memory device). The first expected sum code indicates the number of MLCs that will be programmed to at least a first programming level (e.g. the total number of cells programmed to a first programming level and to a second programming level). The second expected sum code indicates the number of MLCs that will be programmed to a second programming level.

The MLCs in the memory array (e.g. page) are read at various wordline voltages, and first and second as-read sum codes are calculated. In one embodiment, the initial wordline voltage is the lowest allowed wordline voltage, and, after reading the MLCs, the wordline voltage is incremented. Alternatively, the wordline voltage starts high and is decremented, or is otherwise changed to obtain the desired comparison information. The first as-read sum code indicates the number of MLCs read at the first programming level or at the second programming level (i.e. the total number of cells read at L1 and L2). The second as-read sum code indicates the number of MLCs read at the second programming level.

The as-read sum codes at each wordline voltage are compared to the corresponding expected sum codes. In some embodiments, the entire range of wordline voltage specified for sensing all programming levels is evaluated. Alternatively, a portion(s) of the wordline range is evaluated. The sum code comparison information is saved, which generally indicates the wordline voltages at which the as-read sum codes agreed with the expected sum codes. A read window (Vt margin) between the first programming level and the second programming level is determined according to the sum code comparison information.

Figure 4:
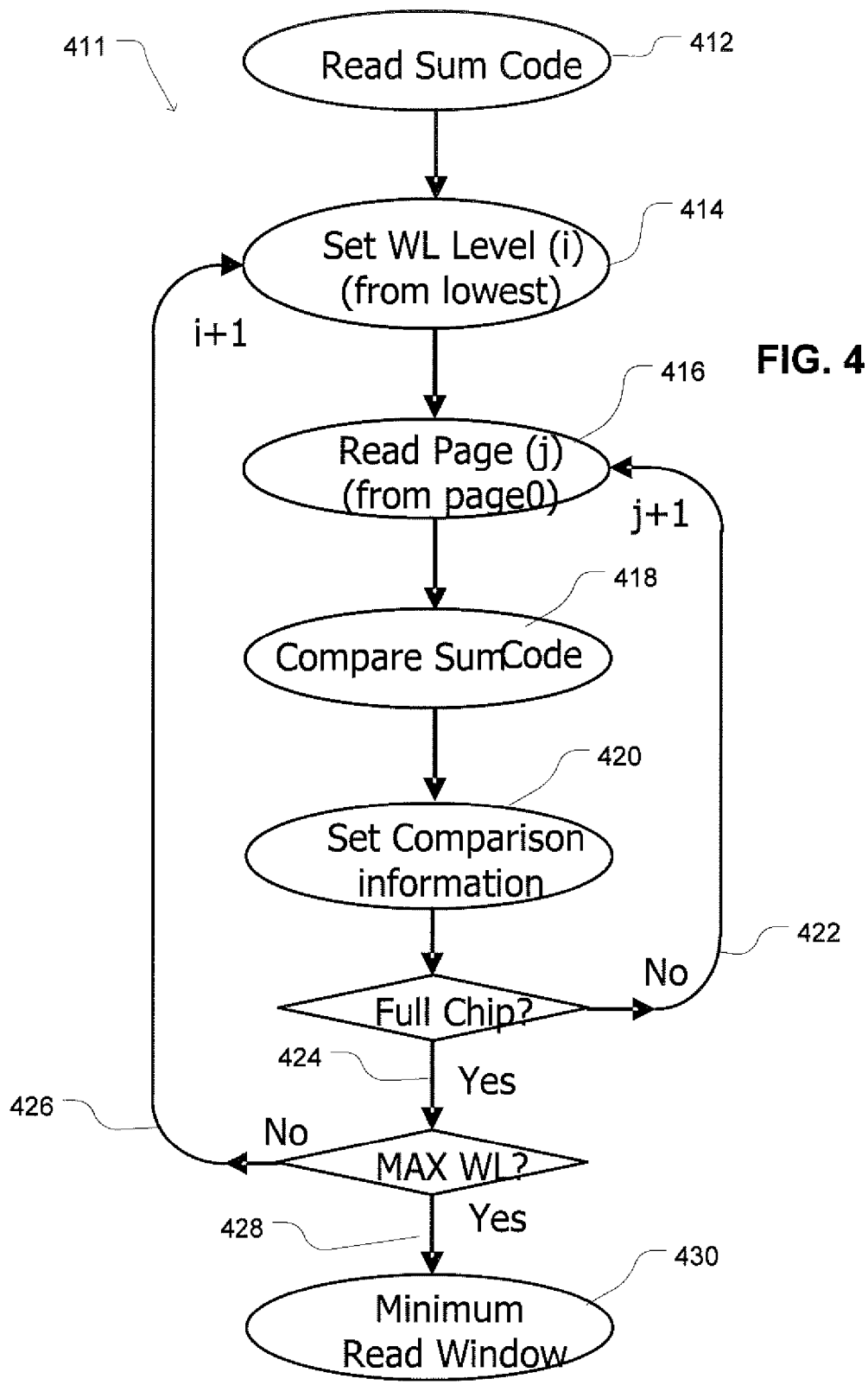
FIG. 4 is a flow chart of a method of operating an MLC-based memory array according to an embodiment of the invention.

FIG. 4 is a flow chart of a method, preferably executed by on chip BIST logic, of operating an MLC-based memory array 411 according to an embodiment of the invention to indicate whether a chip passes a read margin test. A check sum method, comparing the 45-bit sum code (for two-bits per cell in a 2K byte page) based on data read from the page, with the expected 45 bit sum code, is used determine whether a read operation of a page has passed or failed. Pass/fail information is forty-five bits (fifteen bits for each of SUM1, SUM2, SUM3), rather than the 2K bytes of information for each page that is used in conventional methods. This improves test time, reduces the memory resources needed to perform Vt margin testing, and facilitates built-in self test ("BIST") of ICs having MLC-based memory arrays.

According to the method shown in FIG. 4, an expected sum code is calculated from the page data values that will be programmed into a page of the MLC array or the sum code is otherwise provided. The expected sum code is read and stored for access by the test logic (step 412). The wordline level is set to an initial value (e.g. the lowest wordline voltage specified for a read operation) (step 414). The page is read to produce read data (step 416). Using the read data, as-read sum codes are determined and compared against the values loaded in step 412 to provide a comparison result (step 418) for each wordline level. The comparison result for that wordline level is saved (step 420). Referring to FIG. 5C, it is seen that the comparison results can be stored as a simple one bit PASS/FAIL value for each wordline level for each threshold level of the cell. If the entire chip has not been evaluated (branch 422) at this wordline level, the page value is incremented (j+1) and the loop continues until the full chip has been evaluated (branch 424).

The wordline level is evaluated, and if not at the maximum allowed wordline level for the read operation (branch 426), the pages are evaluated at the next wordline level (i+1) to populate a data set like that of FIG. 5C. Alternatively, the wordline value starts at its maximum allowed value and is decremented on each pass of the loop, or the wordline value starts at an arbitrary value and changes on each pass of the loop to another value until all wordline values of interest have been evaluated. Similarly, a page can be evaluated at all wordline values of interest before proceeding to the next page. Other embodiments have alternative sequences of steps.

After the full chip has been evaluated at all wordline values of interest (branch 428), a minimum read window is calculated (step 430), as further described below with reference to FIGS. 5A-5C.

FIG. 5A is an example of a sensing architecture 500 used for reading two bits per cell in parallel. Bit line voltage load circuit 504A provides load current to the MLC cell 502 through clamp circuit 504B, and in a similar manner to three reference cells REF1, REF2, REF3. The load circuit 504A on the bit line for the cell is controlled by a sense enable signal SENB, while the load circuits 504A on the reference cell bit lines are always set on in this example. The reference cells are programmed using a circuit tester, circuit programmer, on-chip reference programming circuit, or other technique so that they each have different threshold voltages. When a wordline voltage (WL) is applied to the reference cells and MLC cell 502, each will produce a different reference current $I_{REF1}$, $I_{REF2}$, $I_{REF3}$, and the MLC cell 502 will produce $I_{CELL}$.

The read operation indicates which of the four programming levels (L0, L1, L2, L3) the MLC cell 502 has been programmed to. The reference cells are biased so that each conducts a reference current inversely proportional to the Vt of its associated programming level.

Sense amplifiers 506, 508, 510 compare $I_{CELL}$ with $I_{REF1}$, $I_{REF2}$, and $I_{REF3}$ to produce data values D1, D2, and D3, respectively. If current through the MLC cell 502 is greater than a reference current, it indicates that the Vth of the MLC cell is less than the Vth of the reference cell. For example, if $I_{CELL}$ is greater than $I_{REF1}$, sense amplifier 506 outputs a D1 value of logic "1". The other sense amplifiers operate in a similar fashion, and the data values (i.e. logic "1" or logic "0") D1, D2, D3 from the sense amplifiers 506, 508, 510 are provided in parallel to a data calculation block 512.

The data calculation block produces a two-bit data output $D_{OUT}$ indicating which level the MLC cell is programmed to. For example, if the MLC cell is in programming level L0, then $I_{CELL}$ is greater than $I_{REF1}$, and greater then $I_{REF2}$, and greater than $I_{REF3}$, and the data calculation block outputs $D_{OUT}$=11 ("one-one"). Similarly, $D_{OUT}$=10 ("one-zero") indicates that the MLC cell is programmed to L1, etc. Table 1 shows a representative relationship between the sense amplifier outputs and $D_{OUT}$:

TABLE 1

| D1 | D2 | D3 | $D_{OUT}$ |
|----|----|----|-----------|
| 1  | 1  | 1  | 11        |
| 0  | 1  | 1  | 10        |
| 0  | 0  | 1  | 01        |
| 0  | 0  | 0  | 00        |

Figure 5B:
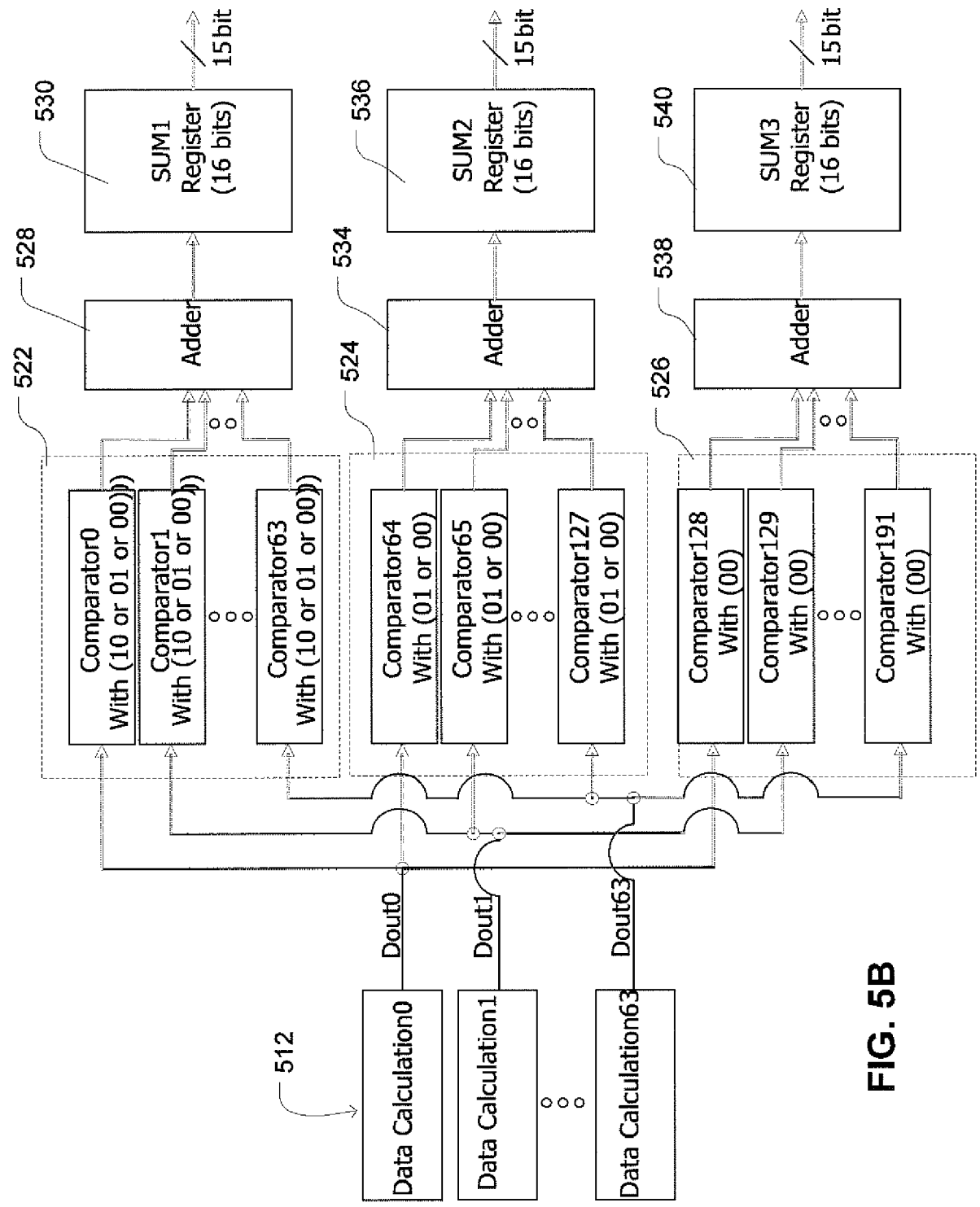
FIG. 5B shows an exemplary sum code calculation block 520 according to an embodiment.

FIG. 5B shows an exemplary sum code calculation block according to an embodiment. The sum code calculation block uses standard logic-based comparator and adder blocks, hence a detailed description of operation is omitted. The data outputs (e.g. $D_{OUT0}$) from a set of data calculation blocks (e.g. 512, see also FIG. 5A, 512, $D_{OUT}$) are provided to three comparator banks 522, 524, 526 for a number of cells. In this example, sixty-four cells are evaluated using 64 sense amplifier/data calculation blocks in parallel. Other numbers of sense amplifiers can be operated in parallel as known in the art.

The first comparator bank 522 compares the data outputs ($D_{OUT0}$, $D_{OUT1}$, ..., $D_{OUT63}$) with a 10, 01, or 00 value, which indicates cells programmed to the L1, L2, or L3 level. The comparator outputs are provided to a first adder 528 to produce SUM1, which is stored in a 16-bit register 530. The second comparator bank 524 compares the data outputs with a 01 or 00 value, which indicates cells programmed to the L2 or L3 level, and provides the outputs to a second adder 534 to produce SUM2, which is stored in a second 16-bit register 536. The third comparator bank 526 compares the data outputs with a 00 value, which indicates the cells programmed to the L3 level, and provides the outputs to a third adder 538 to produce SUM3, which is stored in a third 16-bit register 540.

The first, second, and third comparator banks 522, 524, 526 operate in parallel and, in conjunction with the adders 528, 534, 538, to produce SUM1, SUM2, and SUM3 in parallel. The number of cells programmed to the L3 level is indicated by SUM3. The number of cells programmed to the L2 level is determined by subtracting SUM3 from SUM2 (see FIG. 3), and the number of cells programmed to the L1 level is determined by subtracting SUM2 from SUM1. The remaining cells are at the L0 (erased) level. In other words, during a single read of the sixty-four MLCs, the sum codes SUM1, SUM2, SUM3 indicate how many of the sixty-four MLCs are at L1, L2, and L3. Knowing the total number of cells in the test block also allows one to determine the number of cells at L0, namely, the total number of cells minus SUM1. Using such techniques, an MLC array programmed to different levels can be verified using a single read sequence. It is not necessary to repeatedly read the array at numerous wordline voltages for each programming level (compare FIG. 2B, ref. num. 236).

FIG. 5C shows a truth table for margin measurement using the techniques described herein, for a page of MLC memory in an IC. In the first row of the chart, the wordline voltage level is shown in 100 millivolt increments starting at 4.5 V and ending at 6.1 V. The range from 4.5 to 6.1 V represents a specified range of wordline voltages for the memory array. The first row in the chart labeled "REF1 is wrong?", shows sum code comparison information for the first reference level which indicates that the level of REF1 is wrong for that wordline voltage. Alternatively stated, a "1" the first row indicates that the number of cells read that indicate level L1 did not match the expected number indicated by SUM1, and a "0" indicates that the numbers matched. The second row in the chart labeled "REF2 is wrong?", shows sum code comparison information for the second reference level which indicates that the level of REF2 is wrong for that wordline voltage. Alternatively stated, a "1" the second row indicates that the number of cells read that indicate level L2 did not match the expected number indicated by SUM2 and SUM1, and a "0" indicates that the numbers matched. The third row in the chart labeled "REF3 is wrong?", shows sum code comparison information for the third reference level which indicates that the level of REF3 is wrong for that wordline voltage. Alternatively stated, a "1" the third row indicates that the number of cells read that indicate level L3 did not match the expected number indicated by SUM3, SUM2 and SUM1, and a "0" indicates that the numbers matched.

Starting with a lowest wordline voltage, which is 4.5 V in this example, a page read operation is performed and the sum codes for all three levels are compared to the expected codes. For this low wordline voltage, the comparison for all three sum codes will indicate failure, suggesting that REF1, REF2 and REF3 should be adjusted (REF1 probably too high) or the wordline voltage is out of the proper margin. As the wordline voltage is raised (to 4.8 V in this example), SUM1 will become correct (REF1 is wrong=0 (false)) since the correct total sum number of MLCs programmed to L1, L2 and L3 will be read at this Vt. However, there is no differentiation between the number of cells programmed at different levels (see FIG. 3, SUM1). SUM2 and SUM3 will be wrong (REF2 is wrong=1; REF3 is wrong=1), assuming there are some MLCs in the page at both L2 and L3. As the wordline voltage continues to be raised to its maximum allowed value for a page read operation, the results shown in the truth table 500 are obtained. The values and conditions are merely exemplary, and are provided for purposes of illustration and discussion only.

The read voltage windows between each level against each reference for the page can be determined from the data in the chart shown FIG. 5C. From FIG. 5C, the read window for wordline voltage against REF1 is from 4.8 V to 5.2 V, which means that there are 400 mV between L0 and L1. Similarly, the read window for wordline voltage against REF2 is from 5.0 V to 5.4 V, which means that there are 400 mV between L1 and L2. The read window for wordline voltage against REF3 is from 5.3 V to 5.6 V, which means that there are 300 mV between the L2 and L3. This process is repeated for the other pages of the MLC memory array ("full chip read") and the minimum read voltage windows are obtained.

BIST can be performed by providing a specified minimum read window value(s) to a tester. The BIST logic on the chip automatically performs full chip read operations while the wordline voltage is stepped across its range. The BIST logic, or alternatively the tester, stores the read result, counts the sum codes, and compares the sum codes (see FIG. 6) with the allowable (specified) minimum read window(s). The BIST logic optionally sends PASS/FAIL information for the IC chip. Alternatively, the pass/fail information for individual pages can be provided to the tester, which can configure the MLC memory array to "locked out" failed pages from use by the customer. While this reduces the total memory available to the customer on the IC, it allows use of ICs having one or more pages that fail the minimum read window specification.

Figure 6:
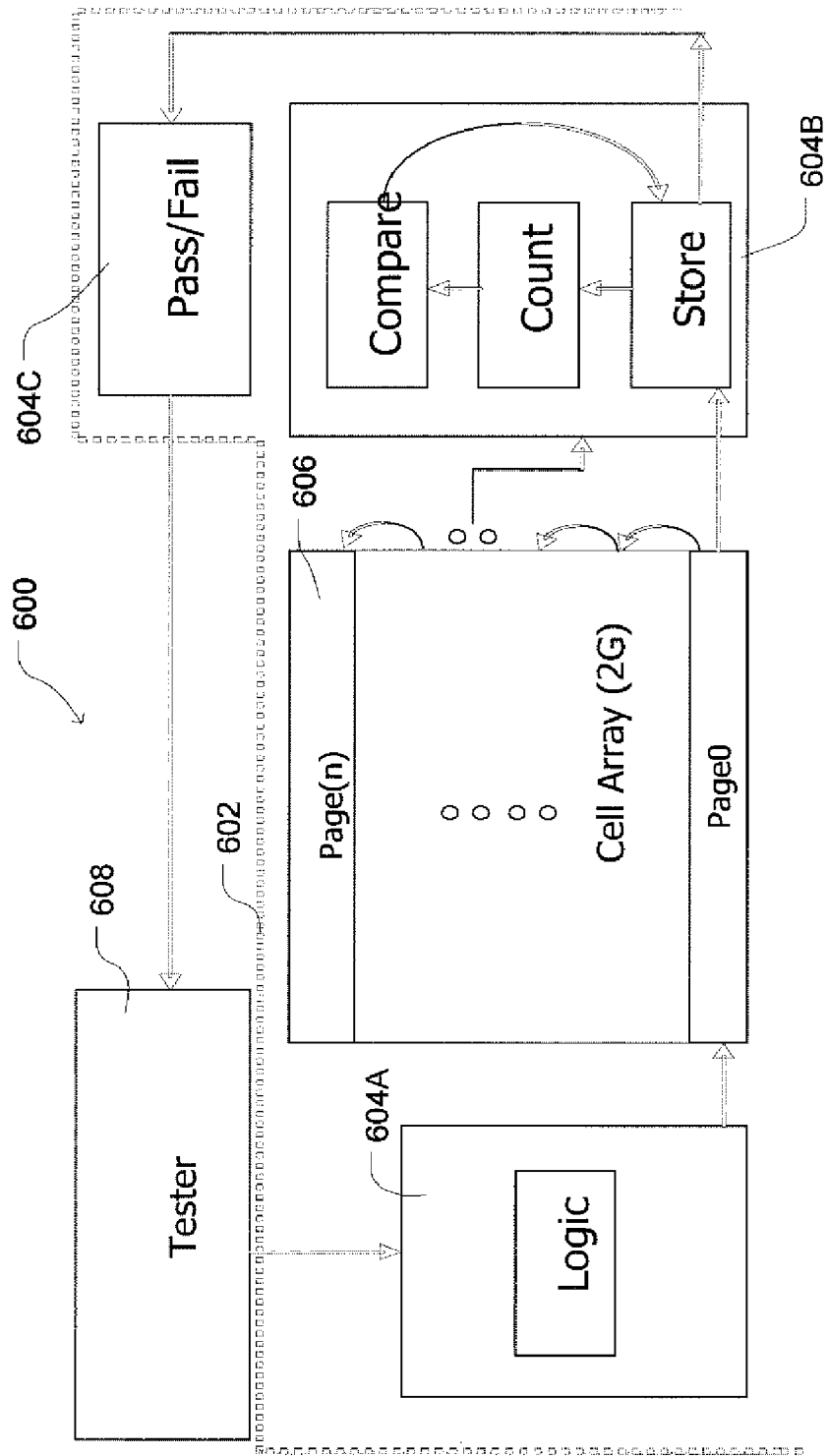
FIG. 6 shows an exemplary diagram of a test system for testing an IC with BIST logic.

FIG. 6 shows an exemplary diagram of a test system 600 for testing an IC 602 with built in self test BIST logic 604A, 604B, 604C (shown as multiple functional blocks for simplicity of illustrating the test flow). The BIST logic can be embedded into the silicon or other semiconductor material of the IC, or temporarily loaded into a programmable logic section of the IC, for example. The BIST logic 604A controls the MLC memory array 606 and wordline voltage, which is supplied by a tester 608 or alternatively is supplied on-chip, during page read operations. The pages of the MLC array 606 are automatically evaluated at the allowable wordline voltages, as described above.

The BIST logic 604B stores the read results, counts the sum codes, and compares the sum codes obtained from the read operations against the specified (allowable) minimum read window(s). The optional BIST logic 604C provides PASS/FAIL data to the tester 608. Alternatively, the sum code values are provided to the tester, which compares them against the expected sum code values and calculates the minimum read voltage windows for the pages or for the IC. In a particular embodiment, the BIST logic 604C provides a FAIL value if any page in the MLC array 606 fails any minimum read widow specification.

Compared to the prior art techniques discussed in reference to FIGS. 2A and 2B, embodiments of the invention have several advantages. First, it is not necessary to find the wordline voltage boundaries of each level, since the read window is determined directly from the sum codes. Second, it is not necessary to save the bit information for the whole chip (entire memory array), but rather, just the expected sum code is saved to be compared against the as-read sum code. Third, the log-data is the sum-bit comparison information, rather than the whole chip bit information. And fourth, it is not necessary to repeat the read operation three times against three different reference values since a parallel read for all three reference levels is performed for generation of the sum codes. Embodiments of the invention provide reliable testing of Vt margins with less testing time, and some embodiments include BIST.

The embodiments described herein are applied to multiple bit cells based on MLC technology. The technology can be applied to single bit cells based on SLC technology as well.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. An integrated circuit, comprising:
    a memory array on the integrated circuit; and
    logic on the integrated circuit configured to program a data set into a block of memory cells in the memory array; and iteratively read the block of memory cells at wordline voltages in a range of wordline voltages, calculating as-read sum code information indicating an as-read number of memory cells at the first programming level and an as-read number of memory cells at the second programming level for respective wordline voltages in the range; and to perform at least one of storing the as-read sum code information on the integrated circuit and supplying the as-read sum code information to an output on the integrated circuit.

2. The integrated circuit of claim 1, including logic on the integrated circuit to analyze the as-read sum code information and provide a PASS/FAIL result.

3. The integrated circuit of claim 1, wherein the logic stores expected sum code information indicating a first number of memory cells programmed to a first programming level for the data set and a second number of memory cells programmed to the second programming level for the data set, and including logic to compare the as-read sum code information to the expected sum code information.

4. The integrated circuit of claim 1 wherein the block of memory cells consists of a page of a multi-level cells ("MLC").

5. The integrated circuit of claim 1 wherein the block of memory comprises multiple level cells having four programming levels, and
    the as-read sum code information comprises a first as-read sum code indicating a first number of memory cells in the block sensed at the first programming level, a second as-read sum code indicating a sum of the first number of memory cells and a second number of memory cells in the block sensed at the second programming level for the known data set, and a third as-read sum code indicating a sum of the first number of memory cells, the second number of memory cells and a third number of memory cells in the block sensed at the third programming level.

6. The integrated circuit of claim 5 wherein the block comprises $2^{N-1}$ bits, and the first as-read sum code, second as-read sum code, and third as-read sum code consist of respective N bit codes.

7. The integrated circuit of claim 1, including a bank of sense amplifiers, the sense amplifiers being arranged to compare a current from a selected cell in the block against a plurality of references in parallel during application of a wordline voltage in the range to indicate the programming level of the selected cell.

8. The integrated circuit of claim 1, including a bank of sense amplifiers, the sense amplifiers being arranged to compare a current from a selected cell in the block against a first reference value, a second reference value, and a third reference value to produce two-bit data output indicating a programming state of the selected cell.

9. The integrated circuit of claim 1, including logic to determine whether the as-read sum code matches expected sum code information, and applying an additional programming process to the block of memory cells if the as-read sum code does not match.

10. A method of operating a memory array, comprising:
    programming a known data set into a block of memory;
    providing expected sum code information indicating a first number of memory cells programmed to a first programming level for the known data set and a second number of memory cells programmed to the second programming level for the known data set;
    executing a test process including iteratively reading the block of memory at wordline voltages in a range of wordline voltages, calculating as-read sum code information indicating an as-read number of memory cells at the first programming level and an as-read number of memory cells at the second programming level for respective wordline voltages in the range, and comparing the expected sum code information to the as-read sum code information to provide sum code comparison information for respective wordline voltages in the range; and
    analyzing the sum code comparison information to determine a read margin for the block of memory.

11. The method of claim 10, wherein said memory array includes a plurality of blocks, and including executing said programming, providing, executing and analyzing for the plurality of blocks to determine whether any of the plurality of blocks has a read margin that does not meet specifications.

12. The method of claim 10 further comprising
    logging the as-read sum code information.

13. The method of claim 10 wherein the block of memory consists of a page of a multi-level cells ("MLC") in a memory device.

14. The method of claim 13 further comprising reading the page using the read margin.

15. The method of claim 10 wherein the block of memory is a portion of a page of an MLC memory device.

16. The method of claim 10 wherein the block of memory comprises multiple level cells having four programming levels, and the expected sum code information includes a first expected sum code indicating a first number of memory cells programmed to a first programming level for the known data set, a second expected sum code indicating a sum of the first number of memory cells and a second number of memory cells programmed to a second programming level for the known data set, and a third expected sum code indicating a sum of the first number of memory cells, the second number of memory cells and a third number of memory cells programmed to a third programming level for the known data set, and the as-read sum code information comprises a first as-read sum code indicating a first number of memory cells in the block sensed at the first programming level, a second as-read sum code indicating a sum of the first number of memory cells and a second number of memory cells in the block sensed at the second programming level for the known data set, and a third as-read sum code indicating a sum of the first number of memory cells, the second number of memory cells and a third number of memory cells in the block sensed at the third programming level.

17. The method of claim 16 wherein the block comprises $2^{N-1}$ bits, and the first as-read sum code, second as-read sum code, and third as-read sum code consist of respective N bit codes.

18. The method of claim 10 wherein the step of iteratively reading includes, for each wordline voltage in the range, coupling a cell to a sense amplifier which simultaneously compares a current from the cell against a plurality of references to indicate the programming level of the cell.

19. The method of claim 10 wherein the step of iteratively reading includes, for each wordline voltage in the range, coupling a cell to a sense amplifier which simultaneously compares a cell current of a memory cell against a first reference value, a second reference value, and a third reference value to produce two-bit data output indicating a programming state of the memory cell.

* * * * *